United States Patent
Piccardi et al.

(10) Patent No.: US 11,495,306 B2
(45) Date of Patent: *Nov. 8, 2022

(54) PEAK CURRENT MANAGEMENT IN A MEMORY ARRAY

(71) Applicant: Micron Technology, Inc., Boise, ID (US)

(72) Inventors: Michele Piccardi, Cupertino, CA (US); Xiaojiang Guo, San Jose, CA (US); Kalyan Chakravarthy C. Kavalipurapu, Hyderabad (IN)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/176,009

(22) Filed: Feb. 15, 2021

(65) Prior Publication Data

US 2021/0166770 A1  Jun. 3, 2021

Related U.S. Application Data

(63) Continuation of application No. 16/400,398, filed on May 1, 2019, now Pat. No. 10,923,199.

(51) Int. Cl.
*G11C 16/26* (2006.01)
*G11C 16/30* (2006.01)
(Continued)

(52) U.S. Cl.
CPC ............... *G11C 16/30* (2013.01); *G05F 3/26* (2013.01); *G11C 16/26* (2013.01); *H02M 3/07* (2013.01)

(58) Field of Classification Search
CPC ..................................................... G11C 16/30
See application file for complete search history.

(56) References Cited

U.S. PATENT DOCUMENTS 8,032,804 B2  10/2011  Jeddeloh
10,923,199 B2 *  2/2021  Piccardi ................. G11C 16/26
(Continued)

FOREIGN PATENT DOCUMENTS

WO   WO-2020223474 A1   11/2020

OTHER PUBLICATIONS

U.S. Appl. No. 16/400,398, Non Final Office Action dated Feb. 28, 2020, 14 pgs.
(Continued)

*Primary Examiner* — Min Huang
(74) *Attorney, Agent, or Firm* — Schwegman Lundberg & Woessner, P.A.

(57) ABSTRACT

An electronic device comprises a multi-chip package including multiple memory dice that include a memory array, charging circuitry, polling circuitry and a control unit. The charging circuitry is configured to perform one or more memory events in a high current mode using a high current level or in a low current mode using a lower current level. The polling circuitry is configured to poll a power status node common to the multiple memory dice to determine availability of the high current mode. The control unit is configured to operate the charging circuitry in the high current mode to perform the one or more memory events when the polling circuitry indicates that the high current mode is available, and operate the charging circuitry in the low current mode to perform the one or more memory events when the polling circuitry indicates that the high current mode is unavailable.

20 Claims, 10 Drawing Sheets

(51) Int. Cl.
  *G05F 3/26* (2006.01)
  *H02M 3/07* (2006.01)

(56) References Cited

U.S. PATENT DOCUMENTS

| | | |
|---|---|---|
| 2003/0081453 A1 | 5/2003 | Hidaka |
| 2007/0070688 A1 | 3/2007 | Kuo et al. |
| 2008/0117686 A1 | 5/2008 | Yamada |
| 2008/0259672 A1* | 10/2008 | Lung .................. H01L 45/1691 438/102 |
| 2012/0005491 A1* | 1/2012 | Bridges ................ G06F 1/3293 713/300 |
| 2012/0023346 A1 | 1/2012 | Byom et al. |
| 2013/0215686 A1* | 8/2013 | Anand .................. G11C 5/147 716/132 |
| 2017/0098469 A1 | 4/2017 | Park |
| 2017/0139590 A1 | 5/2017 | Hsu et al. |
| 2017/0331476 A1* | 11/2017 | Cho ..................... G11C 7/1084 |
| 2020/0350026 A1 | 11/2020 | Piccardi et al. |
| 2021/0357149 A1* | 11/2021 | Yu ......................... G06F 3/0659 |

OTHER PUBLICATIONS

U.S. Appl. No. 16/400,398, Response filed May 28, 2020 to Non Final Office Action dated Feb. 28, 2020, 17 pgs.
U.S. Appl. No. 16/400,398, Final Office Action dated Jun. 16, 2020, 12 pages.
U.S. Appl. No. 16/400,398, Response filed Aug. 17, 2020 to Final Office Action dated Jun. 16, 2020, 13 pgs.
U.S. Appl. No. 16/400,398, Advisory Action dated Aug. 25, 2020, 2 pgs.
U.S. Appl. No. 16/400,398, Notice of Allowance dated Oct. 13, 2020, 7 pgs.
"International Application Serial No. PCT/US2020/030698, International Search Report dated Aug. 10, 2020", 4 pgs.
"International Application Serial No. PCT/US2020/030698, Written Opinion dated Aug. 10, 2020", 7 pgs.

* cited by examiner

PEAK CURRENT MANAGEMENT IN A MEMORY ARRAY

PRIORITY APPLICATION

This application is a continuation of U.S. application Ser. No. 16/400,398, filed May 1, 2019, which is incorporated herein by reference in its entirety.

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a memory device, and multiple devices can be combined to form a storage volume of a memory system, such as a solid-state drive (SSD), a Universal Flash Storage (UFS™) device, a MultiMediaCard (MMC) solid-state storage device, an embedded MMC device (eMMC™), etc.

A memory system can include one or more processors or other memory controllers performing logic functions to operate the memory devices or interface with external systems. The memory matrices or arrays can include a number of blocks of memory cells organized into a number of physical pages. The memory system can receive commands from a host in association with memory operations, such as read or write operations to transfer data (e.g., user data and associated integrity data, such as error data and address data, etc.) between the memory devices and the host, erase operations to erase data from the memory devices, or perform one or more other memory operations.

Memory is utilized as volatile and non-volatile data storage for a wide range of electronic applications, including, for example, personal computers, portable memory sticks, digital cameras, cellular telephones, portable music players such as MP3 players, movie players, and other electronic devices. Memory cells can be arranged into arrays, with the arrays being used in memory devices.

Many electronic devices include several main components: a host processor (e.g., a central processing unit (CPU) or other main processor); main memory (e.g., one or more volatile or non-volatile memory device, such as dynamic RAM (DRAM), static RAM (SRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, or combination of volatile and non-volatile memory, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Memory devices can include arrays of memory cells. The memory cells are accessed using access lines and data lines. Memory events such as memory read and memory program operations typically involve charging the access lines and data lines. This charging can generate a supply current ($I_{CC}$) peak during operation. Memory devices and systems (both for mobile and enterprise markets) may have to meet low power consumption requirements. As part of these requirements, the memory devices and systems may operate according to a specified power or peak current ($I_{CC}$) envelope.

As a result, some examples described herein include various structures and methods for performing memory events (for example reading and/or writing data to groups of memory cells) in either a low current mode (which in many examples will require more time) or a high current mode (which in many examples will be quicker). In some examples described herein, pending or ongoing operations in multiple memory die can be monitored relative to the impact of those operations on a power or peak current envelope for the multiple memory die, with the monitoring used to control whether an example memory operation will be performed in either high current mode or low current mode. In some examples, multiple memory die in an electronic system will each monitor the power mode utilized in other memory die in the system to control performing operations in either high current mode or low current mode.

Figure 1:
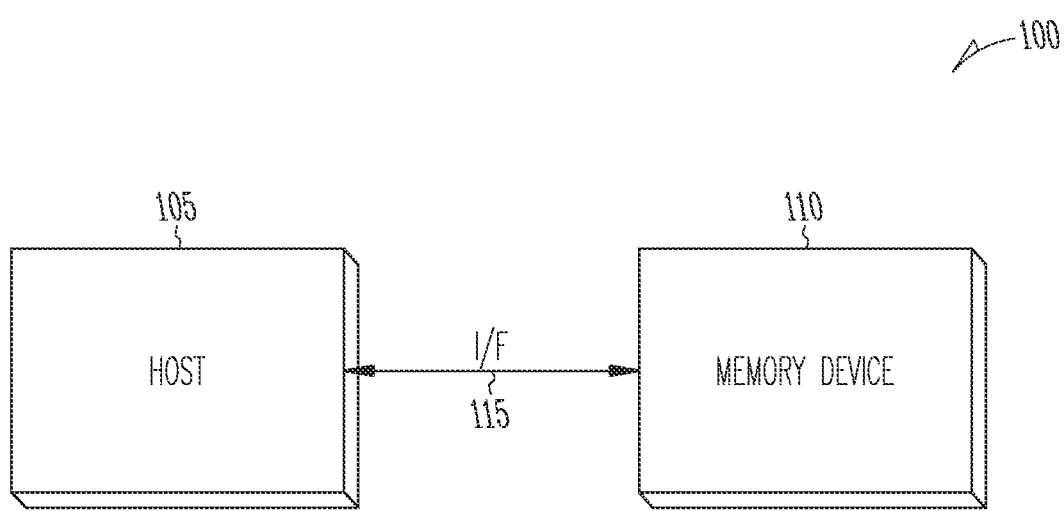
FIG. 1 illustrates an example system including a host and a memory device according to some examples described herein.

FIG. 1 illustrates an example system 100 including a host 105 and a memory device 110. The host 105 can include a host processor, a central processing unit, or one or more other device, processor, or controller. The memory device 110 can include a universal flash storage (UFS) device, an embedded MMC (eMMC™) device, or one or more other memory devices. The host 105 and the memory device 110 can communicate using a communication interface (I/F) 115 (e.g., a bidirectional parallel or serial communication interface).

In an example, the memory device 110 can include a UFS device, and the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, the memory device 110 can include an eMMC™ device, and the communication interface 115 can include a number of parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the memory device 110 can include one or more other memory devices, or the communication interface 115 can include one or more other interfaces, depending on the host 105 and the memory device 110. The identified standards are provided only as example environments in which the described methods and structures may be utilized; but such methods and structures may be utilized in a variety of environments outside of the identified standards (or of any actual or proposed standards).

Each of the host 105 and the memory device 110 can include a number of receiver or driver circuits configured to send or receive signals over the communication interface 115, or interface circuits, such as data control units, sampling circuits, or other intermedia circuits configured to process data to be communicated over, or otherwise process data received from the communication interface 115 for use by the host 105, the memory device 110, or one or more other circuits or devices.

The memory device 110 can include a memory array (e.g., one or more arrays of memory cells, such as a NAND flash memory array, or one or more other memory arrays), a memory control unit, and in certain examples, an interface circuit between the memory array and the memory control unit. In certain examples, the memory array can include a number of memory die, each having control logic separate from the memory control unit. The memory control unit can include an application specific integrated circuit (ASIC), a field programmable gate array (FPGA), or one or more other processing circuits arranged or programmed to manage data transfers or operations to, from, or within the memory array.

Figure 2:
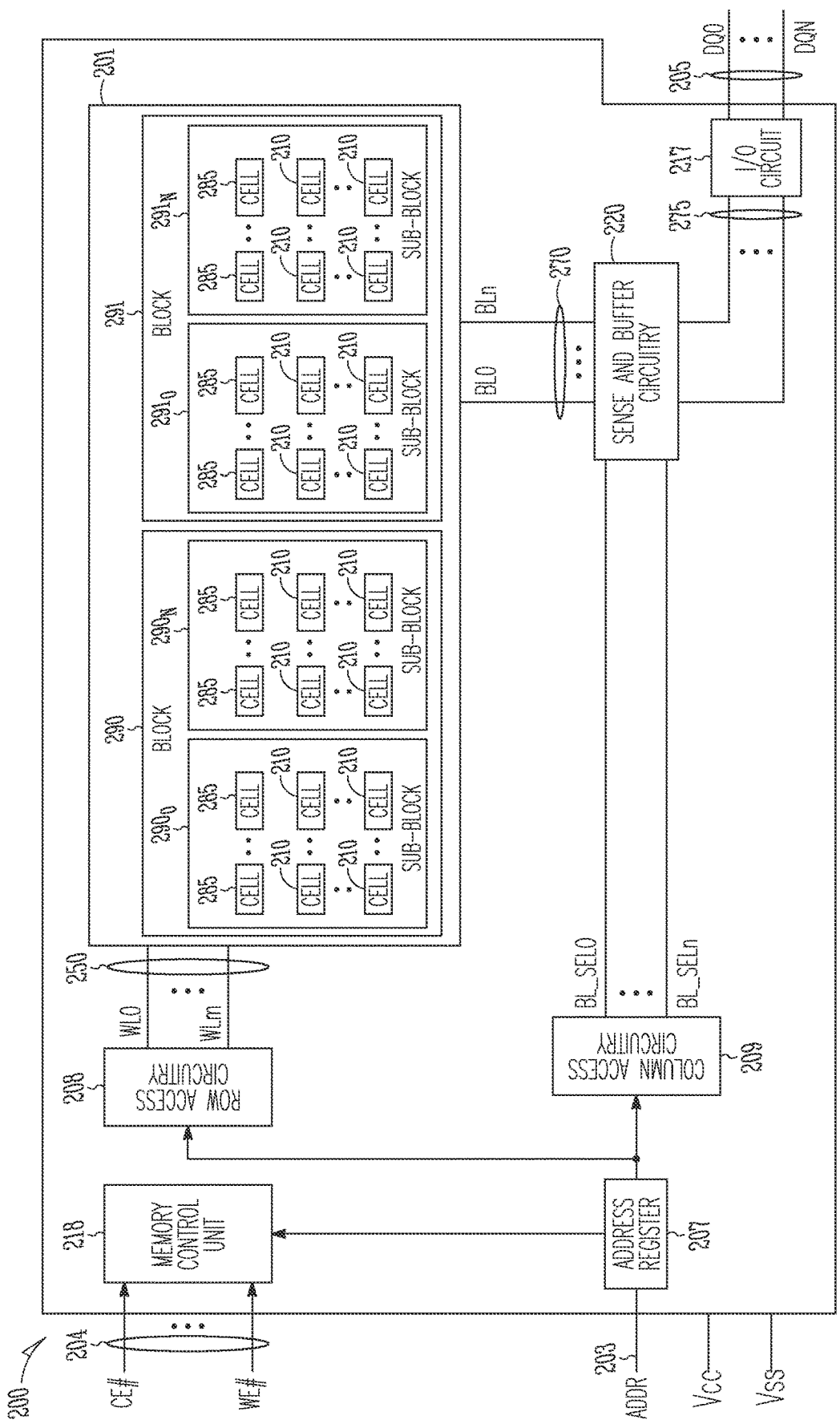
FIG. 2 is a block diagram of an apparatus in the form of a memory device including non-volatile memory cells according to some examples described herein.

FIG. 2 shows a block diagram of an apparatus in the form of a memory device 200 (e.g., memory device 110 in FIG. 1) including non-volatile memory cells having mixed memory cell types integrated in the same integrated circuit (IC) chip, according to some examples described herein. Memory device 200 can include a memory array (or multiple memory arrays) 201 containing memory cells 210 and 285. In the physical structure of memory device 200, memory cells 210 and 285 can be arranged vertically (e.g., stacked over each other) over a substrate of memory device 200 (e.g., a semiconductor substrate of an IC chip that includes memory device 200). Memory cells 210 and 285 can include non-volatile cells. Memory cells 210 and 285 can have different non-volatile memory cell types. For example, memory cells 210 can include floating gate memory cells, charge trap memory cells, or other types of non-volatile memory cells. Memory cells 285 can include ferroelectric memory cells, phase change memory cells, resistive memory cells, conduction bridge memory cells, and spin-transfer-torque magnetic random access memory (STT-MRAM) cells, or other types of non-volatile memory cells.

As shown in FIG. 2, memory cells 210 and 285 can be arranged in blocks (memory cell blocks), such as blocks 290 and 291. Each of blocks 290 and 291 can include sub-blocks. For example, block 290 can include sub-blocks $290_0$ and $290_n$, and block 291 can include sub-blocks $291_0$ and $291_n$. Each of sub-blocks $290_0$, $290_n$, $291_0$, and $291_n$ can include a combination of memory cells 210 and 285. FIG. 2 shows memory device 200 having two blocks 290 and 291 and two sub-blocks in each of the blocks as an example. Memory device 200 can have more than two blocks and more than two sub-blocks in each of the blocks.

As shown in FIG. 2, memory device 200 can include access lines (which can include word lines) 250 and data lines (which can include bit lines) 270. Access lines 250 can carry signals (e.g., word line signals) WL0 through WLm. Data lines 270 can carry signals (e.g., bit line signals) BL0 through BLn. Memory device 200 can use access lines 250 to selectively access sub-blocks $290_0$, $290_n$, $291_0$, and $291_n$ of blocks 290 and 291 and data lines 270 to selectively exchange information (e.g., data) with memory cells 210 of blocks 290 and 291.

Memory device 200 can include an address register 207 to receive address information (e.g., address signals) ADDR on lines (e.g., address lines) 203. Memory device 200 can include row access circuitry 208 and column access circuitry 209 that can decode address information from address register 207. Based on decoded address information, memory device 200 can determine which memory cells 210 of which sub-blocks of blocks 290 and 291 are to be accessed during a memory operation. Memory device 200 can perform a read operation to read (e.g., sense) information (e.g., previously stored information) in memory cells 210, or a write (e.g., program) operation to store (e.g., program) information in memory cells 210. Memory device 200 can use data lines 270 associated with signals BL0 through BLn to provide information to be stored in memory cells 210 or obtain information read (e.g., sensed) from memory cells 210. Memory device 200 can also perform an erase operation to erase information from some or all of memory cells 210 of blocks 290 and 291.

Memory device 200 can include a memory control unit 218 (which can include components such as a state machine (e.g., finite state machine), register circuits, and other components) configured to control memory operations (e.g., read, write, and erase operations) of memory device 200 based on control signals on lines 204. Examples of the control signals on lines 204 include one or more clock signals and other signals (e.g., a chip enable signal CE #, a write enable signal WE #) to indicate which operation (e.g., read, write, or erase operation) memory device 200 can perform.

Memory device 200 can include sense and buffer circuitry 220 that can include components such as sense amplifiers and page buffer circuits (e.g., data latches). Sense and buffer circuitry 220 can respond to signals BL_SEL0 through BL_SELn from column access circuitry 209. Sense and buffer circuitry 220 can be configured to determine (e.g., by sensing) the value of information read from memory cells 210 (e.g., during a read operation) of blocks 290 and 291 and provide the value of the information to lines (e.g., global data lines) 275. Sense and buffer circuitry 220 can also can be configured to use signals on lines 275 to determine the value of information to be stored (e.g., programmed) in memory cells 210 of blocks 290 and 291 (e.g., during a write operation) based on the values (e.g., voltage values) of signals on lines 275 (e.g., during a write operation).

Memory device 200 can include input/output (I/O) circuitry 217 to exchange information between memory cells 210 of blocks 290 and 291 and lines (e.g., I/O lines) 205. Signals DQ0 through DQN on lines 205 can represent information read from or stored in memory cells 210 of blocks 290 and 291. Lines 205 can include nodes within memory device 200 or pins (or solder balls) on a package where memory device 200 can reside. Other devices external to memory device 200 (e.g., a memory controller, memory control unit, or a processor) can communicate with memory device 200 through lines 203, 204, and 205.

Memory device 200 can receive a supply voltage, including supply voltages Vcc and Vss. Supply voltage Vss can operate at a ground potential (e.g., having a value of approximately zero volts). Supply voltage Vcc can include an external voltage supplied to memory device 200 from an external power source such as a battery or alternating current to direct current (AC-DC) converter circuitry.

Each of memory cells 210 can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell that can store more than one bit of data per cell (i.e., that can represent more than two programmed states).

In another example, each of memory cells 210 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 200 can include a non-volatile memory device, such that memory cells 210 and 285 can retain information stored thereon when power (e.g., voltage Vcc, Vss, or both) is disconnected from memory device 200. For example, memory device 200 can be a flash memory device, such as a NAND flash (e.g., 3-dimensional (3-D) NAND) or a NOR flash memory device, or another kind of memory device, such as a variable resistance memory device (e.g., a phase change memory device or a resistive RAM (Random Access Memory) device). One of ordinary skill in the art may recognize that memory device 200 may include other components not shown in FIG. 2 so as not to obscure the example embodiments described herein.

In memory device 200, memory cells 210 can be configured to store information (e.g., user data). Memory cells 285 may not be configured to permanently store information such as user information, but they may be used by memory device 200 as temporary storage cells during an operation (e.g., a write operation) of storing information (e.g., user data) in memory cells 210 in order to improve operations of memory device 200.

For a multiple integrated circuit (IC) dice device, each IC die may generate an $I_{CC}$ peak during operation, particularly but not exclusively during activation of one or more of row access circuitry 208, column access circuitry, and sense circuitry. The memory devices and systems may use peak power management (PPM) to control operation within the $I_{CC}$ envelope.

An approach to PPM is to limit the number of IC die that can perform memory events that use high current at the same time. The high current memory events can include memory program operations, memory read operations, memory program verify operations, and memory erase operations. When one IC die (or a maximum count of IC die) is executing a high current memory event, the other dice of the package or system must wait to begin their high current memory events until the first IC die is finished with the high current memory event and operating in the high current mode is then available to the other dice. The other IC dice may each take a turn (e.g., a round-robin based protocol) waiting and then executing the high current memory event as the high current mode becomes available for them to use. A drawback of this approach is that the wait time by the IC dice introduced by the PPM protocol as well as the overhead of the protocol itself reduces overall system bandwidth and can increase system latency.

Figure 3:
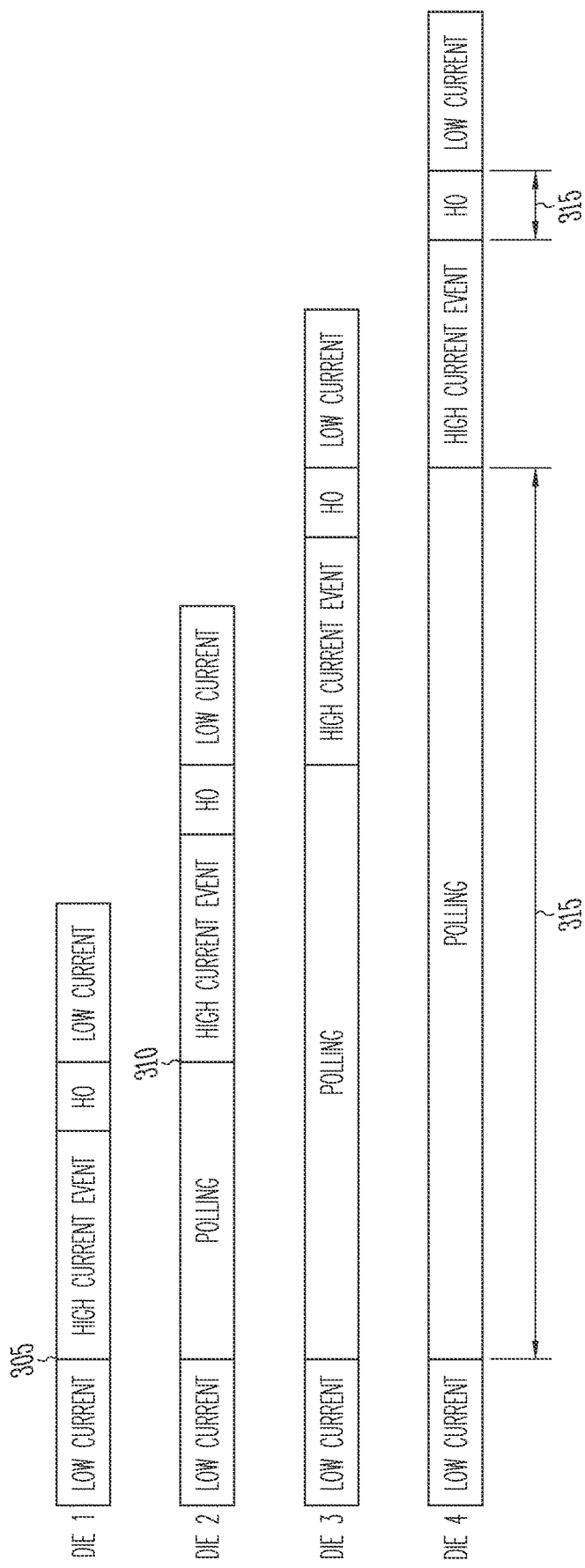
FIG. 3 is a timing diagram of an example of operation of a multi-dice device according to some examples described herein.

FIG. 3 is a timing diagram of an example of operation of a four-dice device that shows the delay due to the dice waiting and taking turns to perform a high current memory event. The first IC die (DIE 1) is the first to enter a high current mode 305 to perform a high current memory event. The other dice poll to see if they are able to perform their high current memory event. If not, the other dice wait and do not perform their high current memory event. When the first die finishes the high current memory event, the circuitry of the first die may execute a handover (HO) protocol 320 (e.g., a signaling protocol or PPM protocol) to notify the other IC dice that the high current mode is available. In the Example of FIG. 3, after HO protocol 320, the second die (DIE 2) enters the high current mode 310 and begins executing a high current memory event. The second die hands off to the third die (DIE 3) to execute a memory event. Eventually the fourth die (DIE 4) can execute a memory event. It can be seen from the example in FIG. 3, that the delay 315 in all N dice of an N dice memory device performing the high current memory events can be up to (N−1) times the duration of a memory event. If the handover protocol is performed, the delay 315 incudes N times the duration of the handover protocol.

Figure 4:
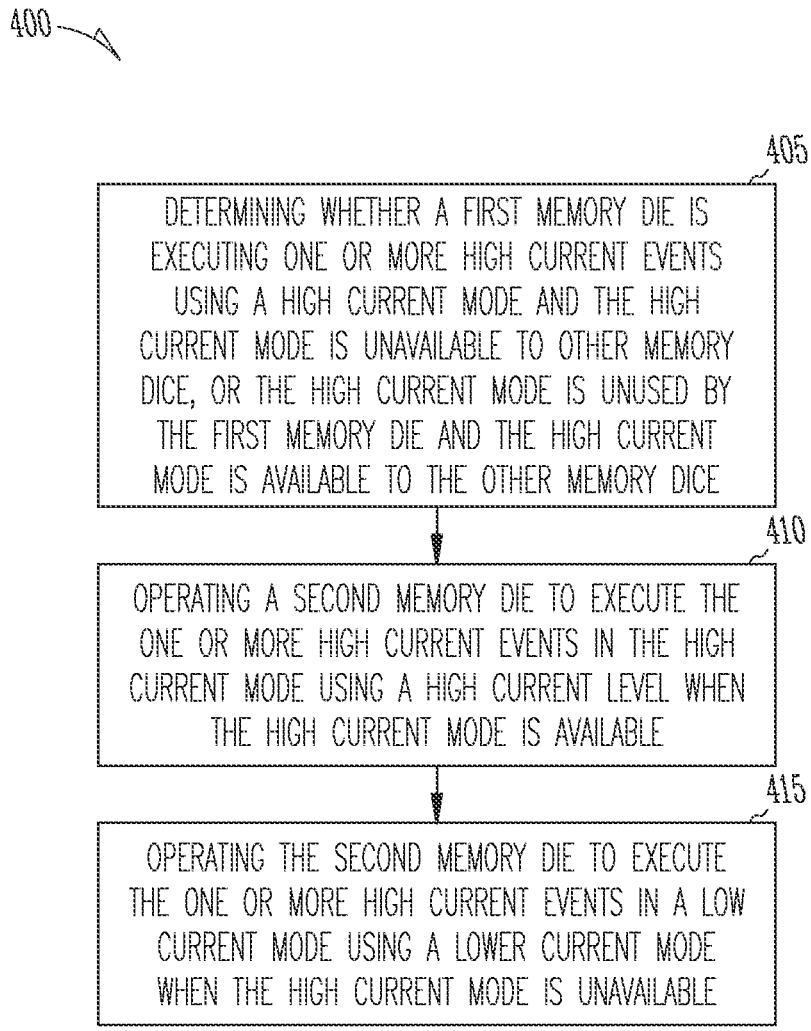
FIG. 4 is a flow diagram of an example of a method of operating a memory device according to some examples described herein.

FIG. 4 is a flow diagram of an example of a method of operating a memory device that includes multiple memory dice. The method 400 improves the overall bandwidth of the memory device by reducing the overall delay in performing the memory events. Each of the memory die of the memory device includes charging circuitry that can perform one or more memory events using either a high current level or a low current level. The high current level is used in a high current mode and the lower current level is used in a low current mode. At 405, it is determined whether one of the memory dice (e.g., a first memory die) is executing a memory event using the high current mode. If the high current mode is in use, the high current mode may be unavailable to the other memory dice of the device. If the high current mode is not currently being used, the high current mode may be available to the other memory dice for selection. Alternatively, the low current may be always available to all IC dice to guarantee maximum execution parallelism within the PPM ICC envelope.

At 410, a second memory die operates to execute a memory event in the high current mode using the high current level when the high current mode is available. If the high current mode is in use by another memory die, the high current mode is unavailable to the second memory die. However, instead of waiting for the high current mode to become available, at 415 the second memory die executes the memory event in the low current mode using the lower current level. The number of IC dice that can execute in parallel using the high current mode depends on system $I_{CC}$ requirements, and could be from a minimum of one IC die to nearly all the IC dice in the system.

Figure 5:
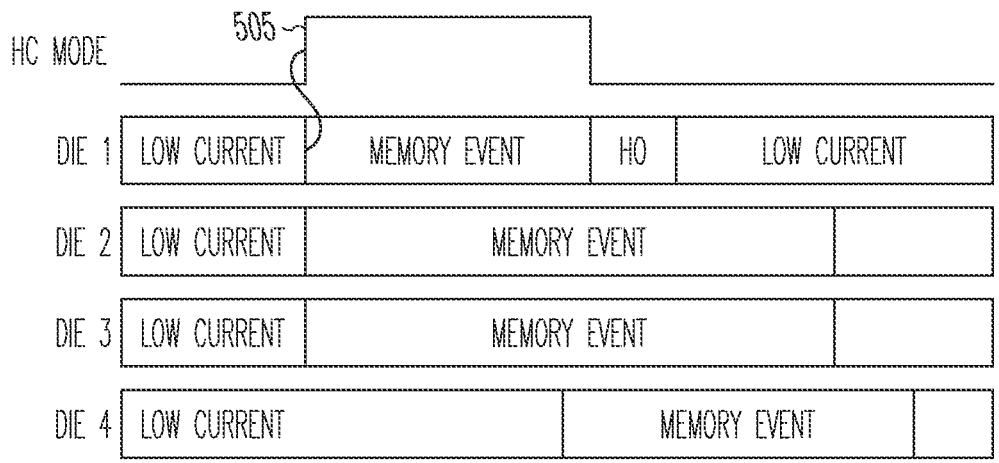
FIG. 5 is a timing diagram of another example of operation of a multi-dice device according to some examples described herein.

FIG. 5 is a timing diagram of another example of operation of a four-dice memory device. When the first memory die (DIE 1) is operating in the high current mode 505 to execute its memory event, the second memory die (DIE 2) and the third memory die (DIE 3) are shown executing a memory event in the low current mode. DIE 4 begins executing its memory event later than DIE 2 or DIE 3, but the high current mode is still unavailable to DIE 4 because DIE 1 is still in the high current mode. Thus, all the memory dice except DIE 1 may execute their memory events in the low current mode, and none of the memory dice wait for the high current mode to become available before executing the memory events. The execution speed of the memory event by any of Die 2-4 is slowed, but the overall bandwidth at the system level may increase due to elimination of the wait time due to polling and protocol handover for the IC dice executing in low current mode.

Figure 6:
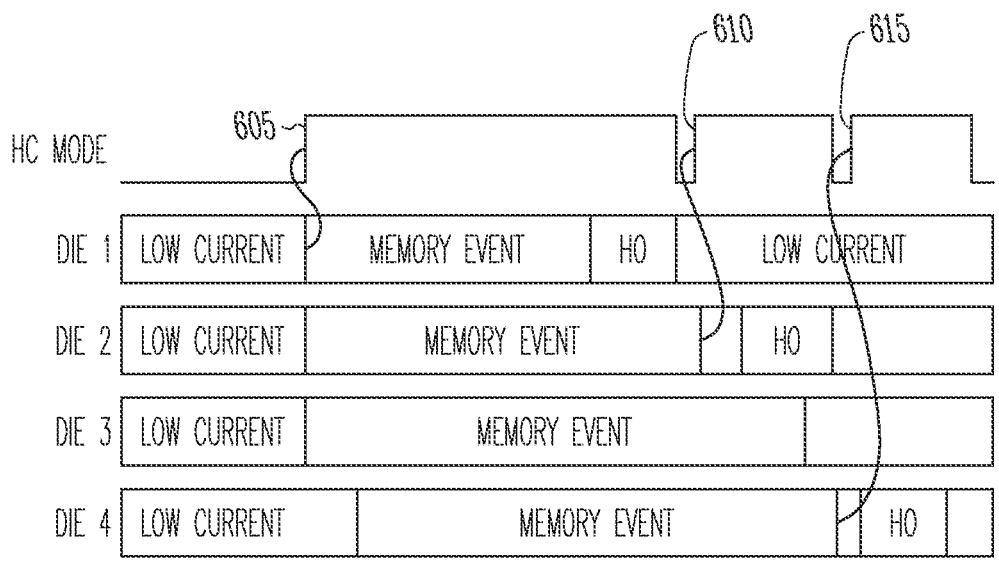
FIG. 6 is a timing diagram of still another example of operation of a multi-dice device according to some examples described herein.

FIG. 6 is a timing diagram of another example of operation of a four-dice device. In the example of FIG. 6, the operation of a memory die can change from the low current mode to the high current mode during a memory event if the high current mode becomes available to the memory die. As in the example of FIG. 5, when the first memory die (DIE 1) is operating in the high current mode 605, the second memory die (DIE 2), the third memory die (DIE 3), and the fourth memory die (DIE 4) are shown operating in the low current mode to execute their memory events. However, at 610 DIE 2 is shown changing its operation from the low current mode to the high current mode when DIE 1 completes its memory event and releases the high current mode using the handover protocol. When DIE 2 completes its memory event, at 615 DIE 4 is shown changing its operation from the low current mode to the high current mode when DIE 2 releases the high current mode. DIE 3 completes its memory event in the low current mode before DIE 2 makes the high current available.

The examples so far have described a memory device where one die is allowed in the high current mode. In a more general case there may be N die and M of the N die are able to execute in the high current mode without limitation, where N and M are integers and M is less than or equal to N. When M dice are in the high current mode the remaining N-M dice don't halt execution of their memory events, but instead proceed to execute the events in the low power mode. The execution speed of the memory event by any of N-M is slowed, but the overall bandwidth at the system level may increase due to elimination of the wait time due to polling and protocol handover for the IC dice executing in low current mode.

Figure 7:
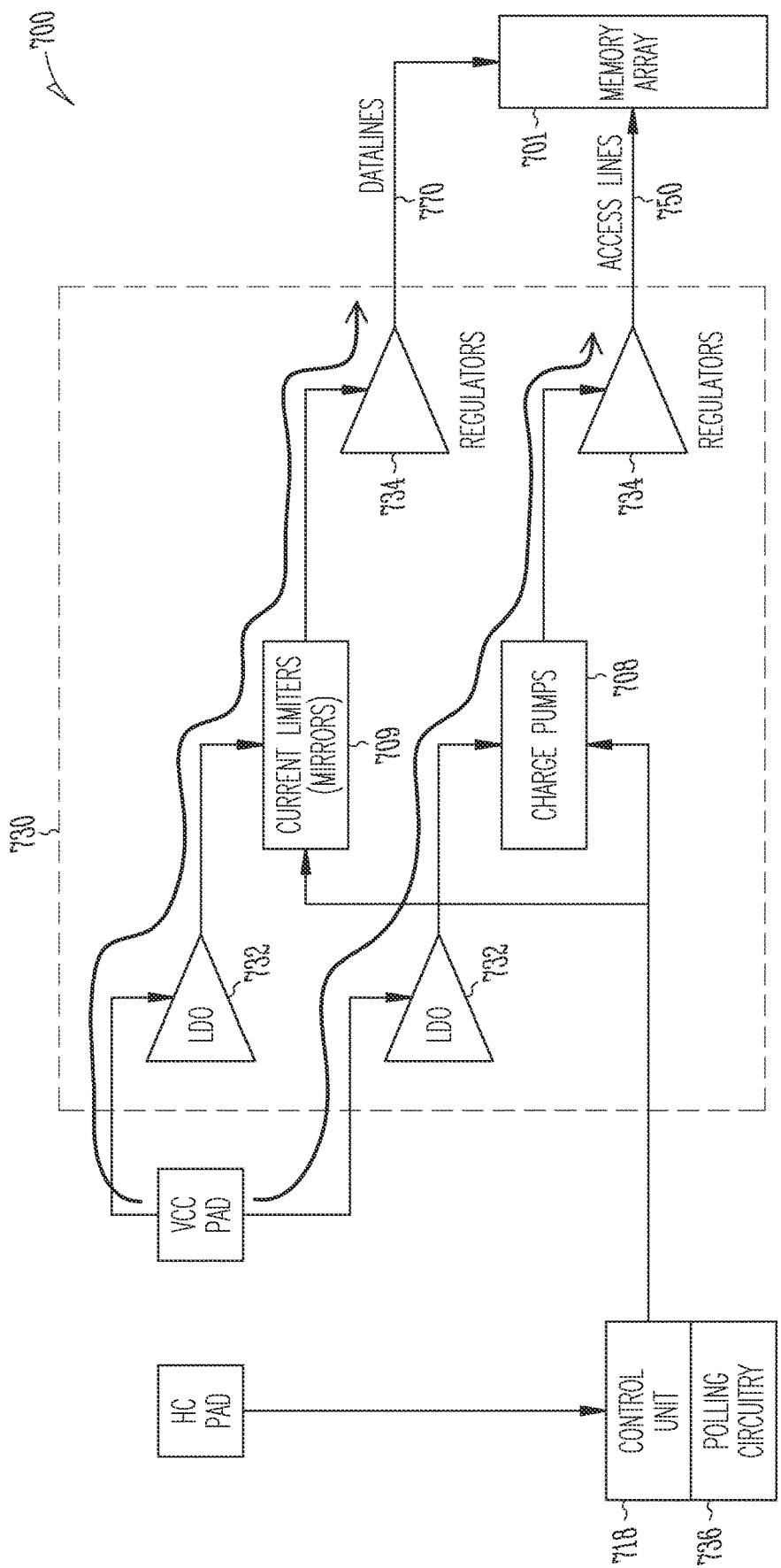
FIG. 7 is a block diagram of an example portions of one memory die of a multi-chip package including multiple memory dice according to some examples described herein.

FIG. 7 is a block diagram of portions of an example memory die 700 of a multi-chip package including multiple memory dice. The memory die 700 includes charging circuitry 730 and a memory control unit 718. The charging circuitry 730 performs one or more memory events in a high current mode using a high current level or performs the memory events in a low current mode using a lower current level. The memory die 700 may also include a memory array 701. The memory events can include portions of one or more of a memory program operation, a memory read operation, a memory program verify operation, and a memory erase operation. The arrows show the flow of current for the memory events.

The memory events can include charging of the access lines 750. The access line circuitry can include low drop out (LDO) voltage regulator 732, charge pump circuitry 708 that can include multiple charge pumps, and voltage regulator 734 circuitry that can include multiple regulators. The access lines may have a high capacitive load. Charging the access lines faster using higher current leads to faster memory operations. Conversely, charging the access lines with lower current slows the memory operations. The charge pump circuitry 708 may include a switching charge pump circuit that has an operating frequency. Increasing the operating frequency increases the current and charge available to charge the access lines. Decreasing the operating frequency increases the time needed to charge the access lines. Operating the charge pump circuitry in a high current mode can include increasing the operating frequency for the high current mode and decreasing the operating frequency for the low current mode.

The memory events may include charging of the data lines 770. The data line circuitry can include LDO voltage regulator 732 connected to a supply rail (VCC), current mirror circuitry 709, and voltage regulators 734. Like the access lines, higher current charges the data lines 770 faster. A lower current level from the current mirrors slows the charging of the data lines. Operating the current mirror circuitry in a high current mode can include enabling more current mirrors to increase the current used to charge the data lines, and operating the current mirror circuitry in the low current mode can include enabling a lower number of current mirrors to lower the current used to charge the data lines.

Figure 8:
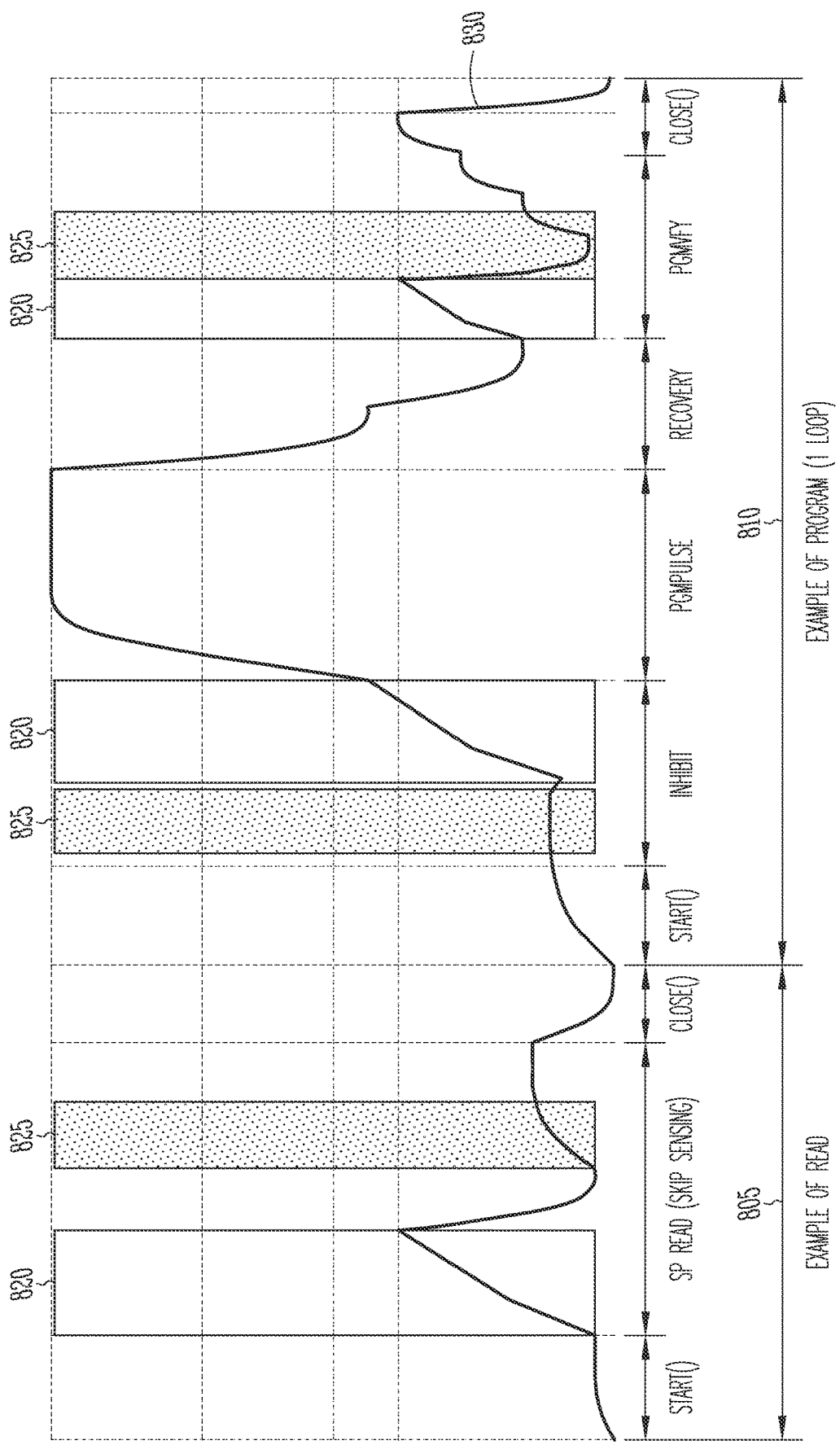
FIG. 8 is an illustration of the charge timing of access lines and data lines associated with a memory read operation and a memory program operation according to some examples described herein.

FIG. 8 is an illustration of a voltage waveform versus time of an access line associated with a memory read operation 805 and a memory program operation 810. Regions 820 are portions of the memory operations where there can potentially be high current for charging of the access lines (usually charged to voltages between 0v and 30v depending on the specific operation to be performed) and shaded regions 825 are portions of the memory operations where there can potentially be high current for charging of the data lines (usually charged to voltages between 0v and VCC which is typically less than 3.6v).

Returning to FIG. 7, the memory control unit 718 controls operation of the charging circuitry 730 of the memory die 700. The memory die 700 can include polling circuitry 736 that polls a power status interface to determine when the high current mode is available or unavailable. As explained previously herein, the high current mode may be unavailable when one or more other dice are executing a memory event using the high current mode. In some embodiments, the power status interface includes a high current (HC) pad. In certain embodiments the HC pads of all the memory dice are connected together. When a memory die enters the high current mode, it claims or reserves the high current mode by applying a signal (e.g., a logic voltage level or a current value) to the HC pad, such as by using a drive circuit or a pull-down circuit. The memory die determines if another memory die has reserved the high current mode by polling the HC pad. The polling circuitry 736 of the memory die can include one or more of logic circuits and analog circuits to poll the state of the HC pad and determine whether the high current mode is claimed, or the high current mode is currently unclaimed. In certain embodiments, more than one memory die can operate in the high current mode. The memory die may vary the voltage on the HC pad to indicate that it is in the high current mode. In certain embodiments, the power status interface includes multiple bits (e.g., a register) and a memory die sets a bit when it is using the high current mode. This may be useful in the example described previously herein where M of N memory die are allowed to be in the high current mode. The power status interface will reflect how many dice are currently in the high current mode and therefore reflect if the high current mode is available.

The memory control unit 718 operates the charging circuitry in the high current mode to perform the one or more memory events when the polling circuitry indicates that the high current mode is available and operates the charging circuitry in the low current mode to perform the one or more memory events when the polling circuitry indicates that the high current mode is unavailable. In some embodiments, the memory control unit 718 operates the charge pump circuitry 708 at a first higher frequency for the high current mode and decreases the frequency for the low current mode.

Figure 9:
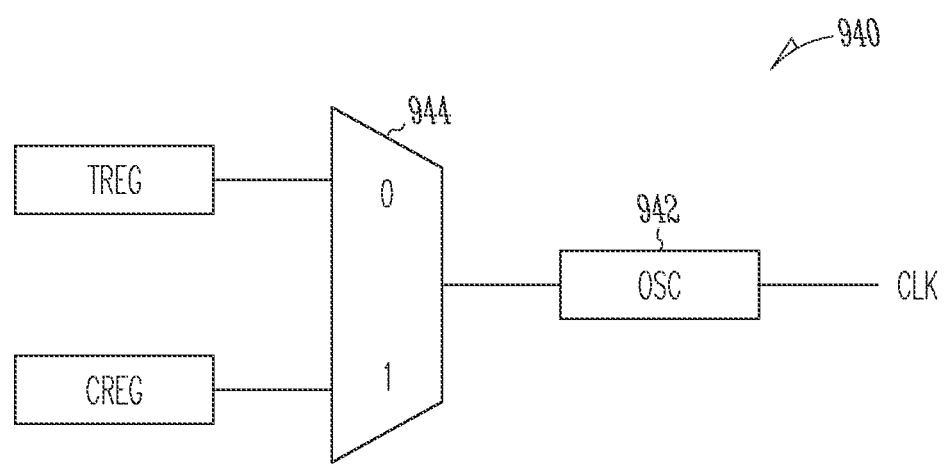
FIG. 9 is a block diagram of an example of portions of a current trim circuit according to some examples described herein.

FIG. 9 is a block diagram of a trim circuit 940 for operating the charge pump circuitry 708 of FIG. 7. The trim circuit 940 includes an oscillator circuit 942 that provides a clock circuit to the charge pump circuitry. Increasing the frequency of the clock signal increases the current level provided by a charge pump circuit (not shown). The trim circuit 940 includes two registers CREG and TREG. The registers hold digital values and the oscillator circuit 942 generates a clock signal according to a digital value provided at an input to the oscillator circuit. Changing the digital value provided to the oscillator circuit changes the frequency of the clock signal. Low current trim register CREG contains a digital value to set the operating frequency for current in the low current mode. High current trim register TREG contains a digital value to set the operating frequency for current in the high current mode. Trim circuit 940 includes a multiplexer 944. The memory control unit 718 sets the control input of the multiplexer 944 to select which register value (CREG or TREG) is applied to the oscillator circuit 942 according to whether the charging circuitry 730 is to operate in the high current mode or the low current mode.

The trim circuit 940 can be used to set the current level of the current mirror circuitry 709 of FIG. 7. The digital value of CREG or TREG is selected by the multiplexer 944 to enable and disable a combination of current mirror circuits to generate a level of current for the low current mode and the high current mode depending on the availability of high current mode indicated by the HC pad. In some embodiments, the memory control unit 718 increases the number of active current mirrors for the high current mode and decreases the number of active current mirrors for the low current mode As explained previously regarding FIG. 6, in some embodiments the memory control unit 718 may change operation of the charging circuitry 730 from the low current mode to the high current mode when the high current mode becomes available while operating in the low current mode.

Figure 10:
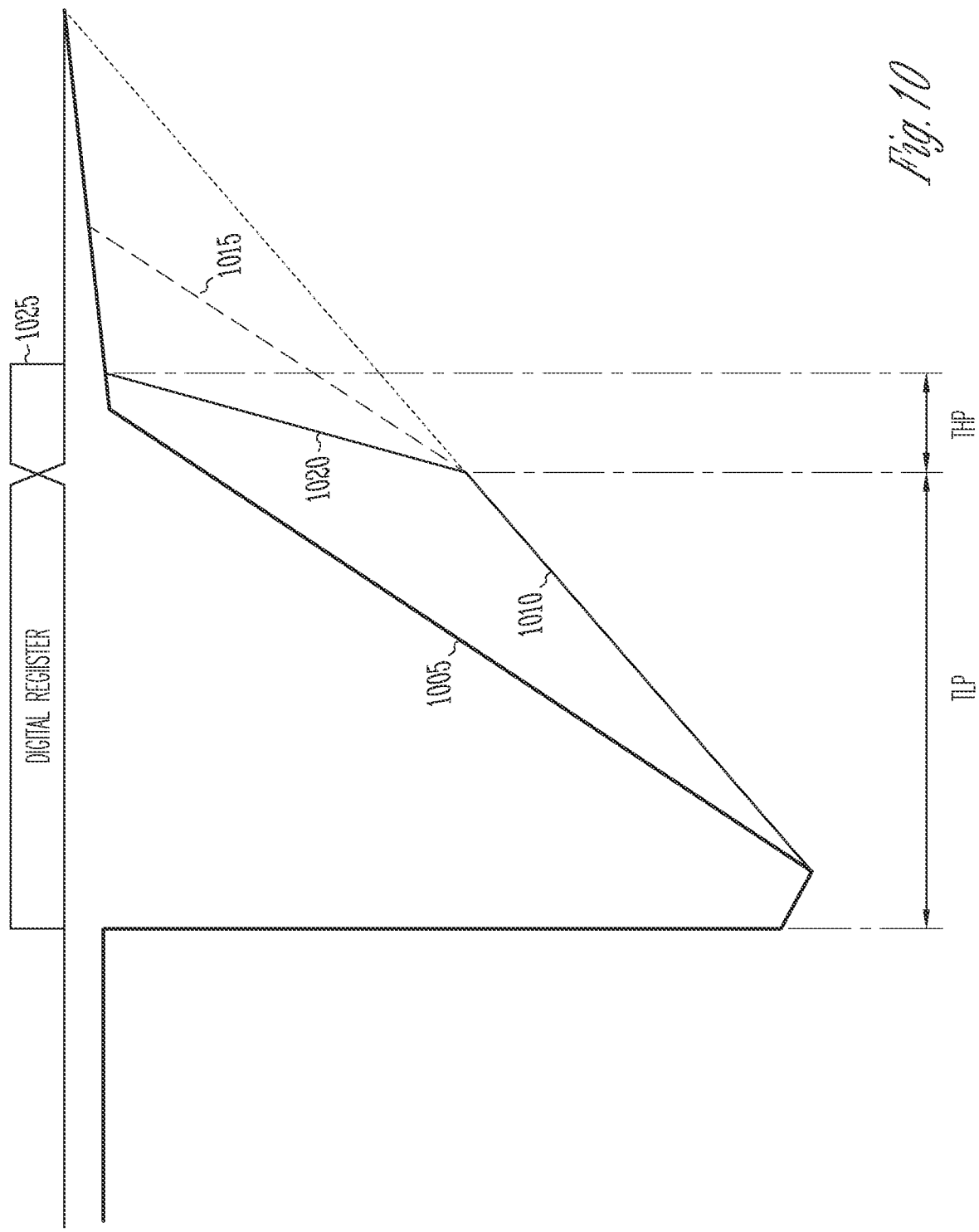
FIG. 10 is an illustration of waveforms associated with the charging of an access line or a data line.

FIG. 10 is an illustration of charging of an access line or a data line, such as an access line 250 or data line 270 of the circuit of FIG. 2, and the charging of which may be under the control of the memory control unit 718 of FIG. 7. Waveform 1005 represents the access line or data line rise time in the high current mode. If the power status interface indicates that the high current mode is immediately available, the access line or data line is charged in the high current mode with the rise time of waveform 1005. In FIG. 6, an access line or data line of DIE 1 would be charged according to waveform 1005. If the power status interface indicates that the high current mode is unavailable when the memory die 700 begins executing the memory event, the access line or data line is charged with the slower rise time shown in waveform 1010 using the lower current. In FIG. 6, DIE 2 would begin charging an access line or data line in the low current mode according to waveform 1010.

If during the charging of the access line or data line in the low current mode, circuitry of DIE 2 detects that the high current mode has become available, the control unit of DIE 2 may change operation of its charging circuitry from the low current mode to the high current mode. In FIG. 6, DIE 2 changes to charging the access line or data line using waveform 1015 in the high current mode. In FIG. 10, waveform 1015 has substantially the same slope as waveform 1005 because the charging current is the same, i.e., the higher level of current in the high current mode.

In some embodiments, the charging circuitry can be operated in a catch-up mode in which the current is higher than the default higher current level. This charging in the catch-up high current mode may be allowed if the increased current level does not violate the overall peak current envelope. In FIG. 10, waveform 1020 represents charging of an access line or a data line in a catch-up high current mode. The slope of waveform 1020 is steeper than the slope of waveform 1005 because the current level is higher in the catch-up high current mode than in the default high current mode.

The methods, devices, and systems described can improve the overall bandwidth and reduce the overall latency in performing high currents while staying within a system power envelope to meet the system power consumption requirements.

Figure 11:
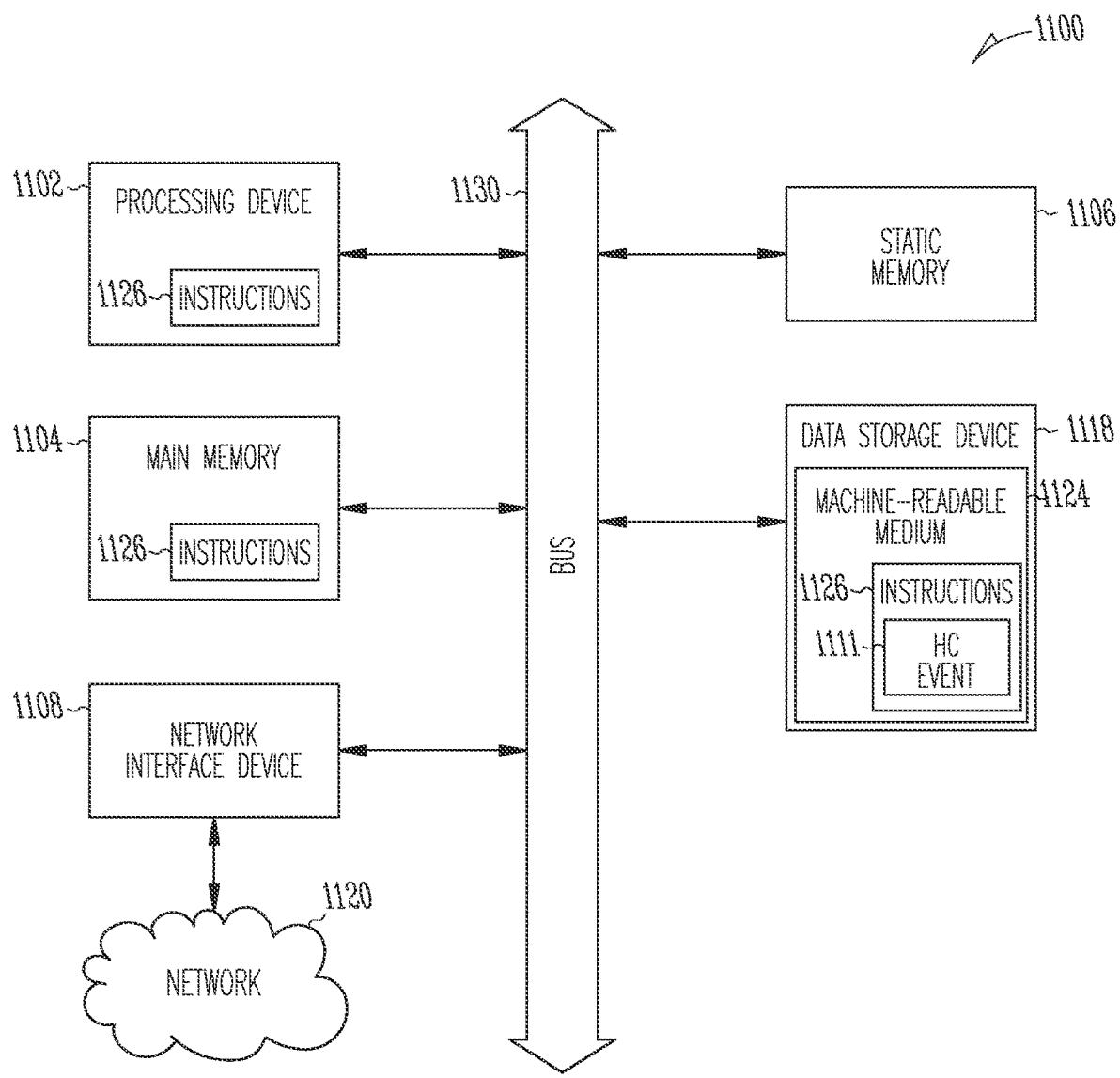
FIG. 11 illustrates a block diagram of an example machine according to some examples described herein.

FIG. 11 illustrates a block diagram of an example machine 1100 upon which any one or more of the techniques (e.g., methodologies) discussed herein may perform, such as the described finer trim programming operations for extreme operating temperatures for example. In alternative examples, the machine 1100 may operate as a standalone device or may be connected (e.g., networked) to other machines. In a networked deployment, the machine 1100 may operate in the capacity of a server machine, a client machine, or both in server-client network environments. In an example, the machine 1100 may act as a peer machine in peer-to-peer (P2P) (or other distributed) network environment. The machine 1100 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The embodiments and examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1100 (e.g., the host 105, the memory device 110 of FIG. 1, etc.) may include a processing device 1102 (e.g., a hardware processor, a central processing unit (CPU), a graphics processing unit (GPU), a hardware processor core, or any combination thereof, such as a memory control unit of the memory device 110, etc.), a main memory 1104 (e.g., read-only memory (ROM), flash memory, dynamic random-access memory (DRAM) such as synchronous DRAM (SDRAM) or Rambus DRAM (RDRAM), etc.), a static memory 1106 (e.g., flash memory, static random-access memory (SRAM), etc.), and a data storage system 1118, some or all of which may communicate with each other via an interlink (e.g., bus) 1130.

The processing device 1102 can represent one or more general-purpose processing devices such as a microprocessor, a central processing unit, or the like. More particularly, the processing device 1102 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1102 can also be one or more special-purpose processing devices such as an application specific integrated circuit (ASIC), a field programmable gate array (FPGA), a digital signal processor (DSP), network processor, or the like. The processing device 1102 can be configured to execute instructions 1126 for performing the operations and steps discussed herein. The machine 1100 can further include a network interface device 1108 to communicate over a network 1120.

The data storage system 1118 can include a machine-readable storage medium 1124 (also known as a computer-readable medium) on which is stored one or more sets of instructions 1126 or software embodying any one or more of the methodologies or functions described herein. The instructions 1126 can also reside, completely or at least partially, within the main memory 1104 or within the processing device 1102 during execution thereof by the machine 1100, the main memory 1104 and the processing device 1102 also constituting machine-readable storage media. The machine-readable storage medium 1124, the data storage system 1118, or the main memory 1104 can correspond to the memory device 110 of FIG. 1. In one implementation, the instructions 1126 include instructions 1111 to implement functionality corresponding to performing a memory event using either a high current mode or a low current mode (e.g., the operation of FIG. 4 to perform a memory event).

While the machine-readable storage medium 1124 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 1100 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 1100 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 1126 (e.g., software, programs, an operating system (OS), etc.) or other data are stored on the data storage device 1118 can be accessed by the main memory 1104 for use by the processing device 1102. The main memory 1104 (e.g., DRAM) is typically fast, but volatile, and thus a different type of storage than the data storage device 1118 (e.g., an SSD), which is suitable for long-term storage, including while in an "off" condition. The instructions 1126 or data in use by a user or the machine 1100 are typically loaded in the main memory 1104 for use by the processing device 1102. When the main memory 1104 is full, virtual space from the data storage device 1118 can be allocated to supplement the main memory 1104; however, because the data storage device 1118 device is typically slower than the main memory 1104, and write speeds are typically at least twice as slow as read speeds, use of virtual memory can greatly reduce user experience due to storage device latency (in contrast to the main memory 1104, e.g., DRAM). Further, use of the data storage device 1118 for virtual memory can greatly reduce the usable lifespan of the data storage device 1118.

In contrast to virtual memory, virtual memory compression (e.g., the Linux™ kernel feature "ZRAM") uses part of the memory as compressed block storage to avoid paging to the data storage device 1118. Paging takes place in the compressed block until it is necessary to write such data to the data storage device 1118. Virtual memory compression increases the usable size of the main memory 1104, while reducing wear on the data storage device 1118.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/ write speeds.

The instructions 1124 may further be transmitted or received over a network 1120 using a transmission medium via the network interface device 1108 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi™, IEEE 802.16 family of standards known as WiMax™), IEEE 802.15.4 family of standards, peer-to-peer (P2P) networks, among others. In an example, the network interface device 1108 may include one or more physical jacks (e.g., Ethernet, coaxial, or phone jacks) or one or more antennas to connect to the network 1120. In an example, the network interface device 1108 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 1100, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, unless stated otherwise the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

ADDITIONAL DESCRIPTION AND EXAMPLES

Example 1 includes subject matter (such as an electronic device) comprising a multi-chip package including multiple memory dice. Each memory die of the multiple memory die includes a memory array, charging circuitry configured to perform one or more memory events in a high current mode using a high current level or in a low current mode using a lower current level, polling circuitry configured to poll a power status node common to the multiple memory to determine availability of the high current mode, and a control unit. The control unit is configured to operate the charging circuitry in the high current mode to perform the one or more memory events when the polling circuitry indicates that the high current mode is available, and operate the charging circuitry in the low current mode to perform the one or more memory events when the polling circuitry indicates that the high current mode is unavailable.

In Example 2, the subject matter of Example 1 optionally includes a control unit configured to change operation of the charging circuitry from the low current mode to the high current mode available during the memory event when the polling circuitry indicates that the high current mode has become available during the memory event.

In Example 3, the subject matter of one or both of Examples 1 and 2 optionally includes charging circuitry that includes access line circuitry operatively coupled to the memory array and configured to operate in the high current mode and the low current mode. The control unit is optionally configured to operate the access line circuitry in the high current mode when the polling circuitry indicates that the high current mode is available, and operate the access line circuitry in the low current mode when the polling circuitry indicates that the high current mode is unavailable.

In Example 4, the subject matter of one or both of Examples 1 and 2 optionally includes charging circuitry that includes data line circuitry operatively coupled to the memory array and configured to operate in the high current mode and the low current mode. The control unit is optionally configured to operate the data line circuitry in the high current mode when the polling circuitry indicates that the high current mode is available, and operate the data line circuitry in the low current mode when the polling circuitry indicates that the high current mode is unavailable.

In Example 5, the subject matter of one or any combination of Examples 1-4 optionally includes the charging circuitry of each memory die further includes charge pump circuitry configured to decrease an operating frequency of the charge pump circuitry from the high current mode to the low current mode.

In Example 6, the subject matter of Example 5 optionally includes a high current trim register and a low current trim register. The charging circuitry is optionally configured to set the operating frequency of the charge pump circuitry according to a value of the high current trim register to set a high current level when the high current mode is available, and set the operating frequency of the charge pump circuitry according to a value of the low current trim register to set a low current level when the high current mode is unavailable.

In Example 7, the subject matter of one or any combination of Examples 1-6 optionally includes the charging circuitry of each memory die includes current mirror circuitry; and the control unit is configured to increase current in the current mirror circuitry from the low current mode to the high current mode when performing the one or more memory events and the polling circuitry indicates that the high current mode has become available.

In Example 8, the subject matter of Example 7 optionally includes a high current trim register and a low current trim register. The charging circuitry is optionally configured to set a current level of the current mirror circuitry according to a value of the high current trim register when the high current mode is available, and set the current level of the current mirror circuitry according to a value of the low current trim register when the high current mode is unavailable.

Example 9 includes subject matter (such as a method of operating a memory device comprising multiple memory dice, or a non-transitory computer readable storage medium including instructions that cause a memory device to perform acts), or can optionally be combined with one or any combination of Examples 1-8 to include such subject matter, comprising performing one or more memory events using a first memory die of the multiple memory dice using a high current mode, wherein the memory events can be performed in the high current mode using a high current level or in a low current mode using a lower current level; indicating by a power status interface when the first memory die is operating in the high current mode and the high current mode is unavailable to other memory dice of the multiple memory dice, and indicating when the high current mode is unused by the first memory die and the high current mode is available to the other memory dice; operating, in response to polling the power status interface, a second memory die to execute the one or more memory events in the high current mode using a high current level when the polling indicates the high current mode is available to the second memory die; and the second memory die to execute the one or more memory events in a low current mode using a lower current level when the polling indicates the high current mode is unavailable to the second memory die.

In Example 10, the subject matter of Example 9 optionally includes changing from operating the second memory die to execute a memory event in the low current mode to executing the memory event in the high current mode when the high current mode has become available to the second memory die.

In Example 11, the subject matter of one or both of Examples 9 and 10 optionally include operating access line circuitry of the memory die to access a memory array of the memory device in the high current mode when the high current mode is available, and operating the access line circuitry to access the memory array in the low current mode when the high current mode is unavailable.

In Example 12, the subject matter of one or any combination of Examples 9-11 optionally includes operating data line circuitry of the memory die to access a memory array of the memory device in the high current mode when the high current mode is available, and operating the data line circuitry to access the memory array in the low current mode when the high current mode is unavailable.

In Example 13, the subject matter of one or any combination of Examples 9-12 optionally includes operating charge pump circuitry of the memory device at a first operating frequency to execute the one or more memory events in the high current mode when the high current mode is available, and operating the charge pump circuitry of the memory device at a second lower operating frequency to execute the one or more memory events in the low current mode when the high current mode is unavailable.

In Example 14, the subject matter of Example 13 optionally includes setting the first operating frequency according to a value stored in a high current trim register when the high current mode is available, and setting the second lower operating frequency according to a value stored in a low current trim register when the high current mode is unavailable.

In Example 15, the subject matter of one or any combination of Examples 9-14 optionally includes operating current mirror circuitry of the memory device at a first current level to execute the one or more memory events in the high current mode when the high current mode is available, and operating the current mirror circuitry of the memory device at a second lower current level to execute the one or more memory events in the low current mode when the high current mode is unavailable.

In Example 16, the subject matter of Example 15 optionally includes setting the first current level according to a value stored in a high current trim register when the high current mode is available, and setting the second lower current level according to a value stored in a low current trim register when the high current mode is unavailable.

Example 17 includes subject matter (such as a memory device) or can optionally be combined with one or any combination of Examples 1-16 to include such subject matter, comprising multiple memory dice. Each memory die of the multiple memory dice includes a memory array including memory cells, charging circuitry configured to perform one or more memory events in a high current mode using a high current level or in a low current mode using a lower current level, a high current mode input-output (I/O) pad, and a memory control unit operatively coupled to the memory array, the charging circuitry, and the high current mode I/O pad. The memory control unit is configured to poll the high current mode I/O pad to determine when the high current mode is available, operate the charging circuitry in the high current mode to perform the one or more memory events when the high current mode is available, and indicate use of the high current mode using the high current mode I/O pad, and operate the charging circuitry in the low current mode to perform the one or more memory events when the high current mode is unavailable.

In Example 18, the subject matter of Example 17 optionally includes charging circuitry configured to perform a memory program verify operation and a memory read operation as a memory event.

In Example 19, the subject matter of one or both of Examples 17 and 18 optionally includes charging circuitry configured to perform a memory program operation as a memory event.

In Example 20, the subject matter of one or any combination of Examples 17-19 optionally includes a memory control unit configured to change operation of the charging circuitry from the low current mode to the high current mode when the high current mode becomes available during operation in the low current mode.

Example 21 includes subject matter (such as a multi-chip package) or can optionally be combined with one or any combination of Examples 1-20 to include such subject matter, comprising multiple memory dice that include a memory array, a power status interface, and a control unit. The power status interface is shared between the multiple memory dice, the power status interface configured to provide an indication of available power. The control unit is in communication with the power status interface and is configured to receive requests for memory events for at least a portion of the memory array of the die; for requested memory events that can be performed in either a high current mode using a high current level or in a low current mode using a lower current level, poll the power status interface to identify available power for the requested memory event; perform a first requested memory event in the high current mode when the polling indicates that the high current mode is available; and perform a second requested memory event in the low current mode when the polling indicates that the high current mode is unavailable.

In Example 22, the subject matter of Example 21 optionally includes a power status interface including a high current mode input-output (I/O) pad and the control unit is configured to poll the high current mode I/O pad to determine when the high current mode is available.

In Example 23, the subject matter of one or both of Examples 21 and 22 optionally includes a power status interface including multiple bits and a memory of the multiple memory dice sets a bit when the memory die is using the high current mode, and the control unit is configured to poll the multiple bits to determine when the high current mode is available.

Example 24 includes subject matter (such as an electronic system) or can optionally be combined with one or any combination of Examples 1-23 to include such subject matter, comprising multiple memory dice that include a memory array, a power status interface, and a control unit. The power status interface is shared between the multiple memory dice, the power status interface configured to provide an indication of available power. The control unit is in communication with the power status interface and is configured to receive requests for memory events for at least a portion of the memory array of the die; for requested memory events that can be performed in either a high current mode using a high current level or in a low current mode using a lower current level, poll the power status interface to identify available power for the requested memory event; perform a first requested memory event in the high current mode when the polling indicates that the high current mode is available; and perform a second requested memory event in the low current mode when the polling indicates that the high current mode is unavailable.

In Example 25, the subject matter of Example 24 optionally includes a power status interface including a high current mode input-output (I/O) pad and the control unit is configured to poll the high current mode I/O pad to determine when the high current mode is available.

In Example 26, the subject matter of one or both of Examples 24 and 25 optionally includes a power status interface including multiple bits and a memory of the multiple memory dice sets a bit when the memory die is using the high current mode, and the control unit is configured to poll the multiple bits to determine when the high current mode is available.

These non-limiting examples can be combined in any permutation or combination. The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A memory integrated circuit (IC) comprising:
    a memory array;
    charging circuitry configured to perform one or more memory events in a high current mode using a high current level or in a low current mode using a lower current level;
    polling circuitry configured to poll a power status node to determine availability of the high current mode to the memory IC; and
    a control unit configured to:
    operate the charging circuitry in the low current mode to perform the one or more memory events when the polling circuitry detects that the common power status node indicates that the high current mode is unavailable and in use by another memory IC; and
    operate the charging circuitry in the high current mode to perform the same one or more memory events when the polling circuitry detects that the common power status node indicates that the high current mode is released by the other memory IC and is available.

2. The memory IC of claim 1, including current mirror circuitry; and
    wherein the control unit is configured to:
    operate the current mirror circuitry at a first current level to execute the one or more memory events in the low current mode when the high current mode is unavailable; and
    operate the current mirror circuitry at a second current level higher than the first current level to execute the one or more memory events in the high current mode when the high current mode is available.

3. The memory IC of claim 2, wherein the control unit is configured to:
    set the first current level according to a value stored in a low current trim register when the high current mode is unavailable; and
    set the second current level according to a value stored in a high current trim register when the high current mode is available.

4. The memory IC of claim 2, wherein the control unit is configured to operate the current mirror circuitry at a third current level higher than the second current level to execute the one or more memory events in the high current mode when the high current mode is available.

5. The memory IC of claim 1,
    wherein the charging circuitry includes charge pump circuitry that operates at a lower frequency in the low current mode and at a higher frequency in the high current mode; and
    wherein the control unit is configured to increase an operating frequency of the charge pump circuitry from the lower frequency to the higher frequency when the high current mode is available.

6. The memory IC of claim 5, wherein the charging circuitry includes a high current trim register and the control unit is configured to store a value in the high current trim register to set the operating frequency of the charge pump circuitry to the higher frequency when the high current mode is available.

7. The memory IC of claim 1, including a high current connection pad, and the power status node is connected to the high current connection pad.

8. A memory device comprising multiple memory dice, each memory die of the multiple memory dice including:
    a memory array;
    charging circuitry configured to charge a memory access line of the memory array in a high current mode using a high current level or in a low current mode using a lower current level;
    polling circuitry configured to poll a power status node common to the multiple memory dice to determine availability of the high current mode;
    a control unit configured to:
    charge the memory access line in the low current mode when the polling circuitry detects that the common power status node indicates that the high current mode is unavailable and in use by another memory dice; and
    charge the memory access line in the high current mode when the polling circuitry detects that the common power status node indicates that the high current mode is released by the other memory dice and is available.

9. The memory device of claim 8, wherein the control unit of each memory die is configured to:
    operate the charging circuitry at a default high current level when the common power status node indicates that the high current mode is available; and
    increase a current level of the high current mode from the default high current level to a current level higher than the default high current level when operating in the high current mode.

10. The memory device of claim 9, wherein the control unit of each memory die is configured to:
    charge the memory access line in the low current mode during a memory event; and
    switch to charging the memory access line at the current level higher than the default high current level when the common power status node indicates that the high current mode becomes available during the memory event.

11. The memory device of claim 10, wherein the memory event includes a memory program verify operation and a memory read operation.

12. The memory device of claim 10, wherein the memory event includes a memory program operation.

13. The memory device of claim 8, wherein each memory die of the multiple memory dice includes current mirror circuitry and the control unit is configured to:
operate the current mirror circuitry at a first current level to charge the memory access line in the high current mode when the high current mode is available; and
operate the current mirror circuitry at a second lower current level to charge the memory access line in the low current mode when the high current mode is unavailable.

14. The memory device of claim 13,
wherein the current mirror circuitry of the memory device includes a high current trim register and a low current trim register; and
wherein the control unit is configured to:
store a value in the high current trim register to set the first current level when the high current mode is available; and
store a value in the low current trim register to set the second lower current level when the high current mode is unavailable.

15. The memory device of claim 8,
wherein the charging circuitry includes charge pump circuitry that operates at a lower frequency in the low current mode and at a higher frequency in the high current mode; and
wherein the control unit is configured to increase an operating frequency of the charge pump circuitry from the lower frequency to the higher frequency when the high current mode is available.

16. The memory device of claim 15,
wherein the charging circuitry includes a high current trim register and a low current trim register; and
wherein the control unit is configured to:
store a value in the high current trim register to set the operating frequency of the charge pump circuitry to the higher frequency when the high current mode is available; and
store a value in the low current trim register to set the operating frequency of the charge pump circuitry to the lower frequency when the high current mode is unavailable.

17. A multi-chip package comprising multiple memory dice and a power status interface shared between the multiple memory dice, wherein each of the multiple memory dice includes:
charging circuitry configured to perform a memory event in a high current mode using a high current level or in a low current mode using a lower current level;
polling circuitry configured to poll the power status interface to determine availability of the high current mode among the multiple memory dice; and
a control unit configured to select operating the charging circuitry in the low current mode to perform the memory event concurrently with memory events performed by another memory die, and switch to operating the charging circuitry in the high current mode concurrently with the memory events performed by the other memory die when determining that the high current mode is released by the other memory die and is available.

18. The multi-chip package of claim 17, wherein the power status interface includes a power status node connected to each memory die of the multiple memory dice via a high current mode input-output (I/O) pad of each memory die.

19. The multi-chip package of claim 17, wherein the power status interface includes multiple bits and a memory die of the multiple memory dice sets a bit of the multiple bits when the memory die is using the high current mode, and the control unit is configured to poll the multiple bits to determine when the high current mode is available.

20. The multi-chip package of claim 17, wherein the power status interface indicates a number of memory die of the multiple memory dice that are in the high current mode and the control unit determines availability of the high current mode according to the indicated number of memory die that are in the high current mode.

* * * * *